United States Patent [19]

Gonen et al.

[11] Patent Number: 5,221,899
[45] Date of Patent: Jun. 22, 1993

[54] SIGNAL ACQUISITION IN MAGNETIC RESONANCE ANALYSIS

[75] Inventors: Oded Gonen, Leonia, N.J.; Glyn Johnson, New York, N.Y.

[73] Assignee: The Trustees of Columbia University in the City of New York, New York, N.Y.

[21] Appl. No.: 692,911

[22] Filed: Apr. 29, 1991

[51] Int. Cl.⁵ .............................................. G01R 33/20
[52] U.S. Cl. ...................................... 324/307; 324/309
[58] Field of Search ............... 324/300, 307, 308, 309, 324/310, 311, 313, 314, 318, 322; 128/653 A

[56] References Cited

U.S. PATENT DOCUMENTS

| | | | |
|---|---|---|---|
| 3,810,001 | 5/1974 | Ernst | 324/314 |
| 4,081,742 | 3/1978 | Hofer et al. | 324/307 |
| 4,319,190 | 3/1982 | Brown | 324/309 |
| 4,629,988 | 12/1986 | Bottomley | 324/309 |
| 4,639,671 | 1/1987 | Macovski | 324/309 |
| 4,665,366 | 5/1987 | Macovski | 324/309 |
| 4,678,995 | 7/1987 | Avison et al. | 324/309 |
| 4,680,546 | 7/1987 | Dumoulin | 324/307 |
| 4,701,708 | 10/1987 | Hardy et al. | 324/311 |
| 4,728,889 | 3/1988 | Gadian et al. | 324/307 |
| 4,771,242 | 9/1988 | Lampman et al. | 324/309 |
| 4,851,777 | 7/1989 | Macovski | 324/309 |
| 4,857,843 | 8/1989 | Macovski | 324/307 |
| 4,906,932 | 3/1990 | Ordidge | 324/309 |
| 4,942,359 | 7/1990 | Sano et al. | 324/309 |

*Primary Examiner*—Michael J. Tokar
*Attorney, Agent, or Firm*—Brumbaugh, Graves, Donohue & Raymond

[57] ABSTRACT

For use in nuclear magnetic resonance (NMR) spectroscopy and magnetic resonance imaging (MRI), a method and apparatus for signal acquisition are disclosed. Preferred processing involves elimination of an unwanted signal by subtraction, in the time domain, of a cancellation signal from a free-induction-decay actual signal. A cancellation signal may be obtained, e.g., by smoothing a free-induction-decay signal, by curve fitting, or by computer simulation.

19 Claims, 2 Drawing Sheets

SIGNAL ACQUISITION IN MAGNETIC RESONANCE ANALYSIS

BACKGROUND OF THE INVENTION

The present invention relates to nuclear magnetic resonance spectroscopy and imaging.

Upon interaction of a radio-frequency electromagnetic pulse with an atomic nucleus in a specimen in a polarizing magnetic field, a characteristic, so-called free-induction decay (FID) resonance signal is produced which can be used for spectroscopic chemical analysis. Such analysis derives mainly from a phenomenon known as chemical shift which is defined as the relative difference between the strength of an external magnetic field and a resulting field at a nucleus; chemical shift is understood as caused by a shielding or impeding influence of the structure of electrons (and nuclei) surrounding a nucleus in an atom (or molecule). As shielding influence may characterize a chemical species, chemical shift may be interpreted in terms of the presence of chemical elements and compounds in a specimen. Chemical analysis may further derive from other interactions, e.g., spin-spin coupling, either "through-bond" (known as "J-coupling") or "through-space" (known as "dipolar coupling"). Under suitable conditions, chemical analysis can be made spatially selective, allowing for 1-, 2-, or 3-dimensional imaging of the local concentration of a nuclear species—hydrogen, for example, or phosphorus.

Often, in nuclear-magnetic-resonance spectroscopy (NMR) or imaging (MRI), a signal of interest may be difficult to acquire due to a dominant response from an extraneous species which may mask or hide the sought-for signal. This is true even in those cases where the dominant signal does not overlap, partially or totally, with the sought signal. The need for accommodating, through the dynamic-range-limited aperture of the detector, the overall dynamic range of a signal dominated by a solvent peak may necessitate a lower gain. This, in turn, may render the smaller signals too small to detect, i.e., below the noise level of the detector. For example, in the case of a specimen in hydrous solution, a dominant response in the form of a "solvent peak" may originate with hydrogen nuclei in water. Thus, in signal acquisition, there is interest in extracting or isolating a signal of interest from a response which may further include one or several extraneous components.

The following disclosures are cited for addressing this and other aspects of nuclear magnetic resonance technology:

U.S. Pat. No. 4,081,742, issued Mar. 28, 1978 to D. C. Hofer et al., disclosing use of a sequence of three radio-frequency signals to reduce a solvent peak in cases where relaxation time of a dominant solvent species is significantly greater than relaxation time of a species of interest;

U.S. Pat. No. 4,319,190, issued Mar. 9, 1982 to T. R. Brown, disclosing simultaneous imaging of several nuclear species;

U.S. Pat. No. 4,629,988, issued Dec. 16, 1986 to P. A. Bottomley, disclosing localized, sub-surface NMR analysis, including application of a "chemical suppression pulse" for selective irradiation of an undesired intense resonance in the chemical-shift spectrum;

U.S. Pat. No. 4,639,671, issued Jan. 27, 1987 to A. Macovski, disclosing simultaneous acquisition of NMR information from a plurality of points in a region of interest, involving use of a time-varying magnetic gradient field;

U.S. Pat. No. 4,665,366, issued May 12, 1987 to A. Macovski, disclosing a further method for the simultaneous acquisition of NMR information from a plurality of points in a region of interest, involving a sequence of radio-frequency excitations in the presence of different time-varying magnetic gradient fields;

U.S. Pat. No. 4,678,995, issued Jul. 7, 1987 to M. J. Avison, disclosing suitable first, second, and third pulse trains as applied to a sample, and differencing of responses obtained with and without the third signals to eliminate a signal component due to water;

U.S. Pat. No. 4,680,546, issued Jul. 14, 1987 to C. L. Dumoulin, disclosing a method for suppressing an NMR signal component due to water, based on a distinction between species as to "quantum coherence'-'—water being characterized as having single quantum coherence, in contrast to species having zero or multiple quantum coherence;

U.S. Pat. No. 4,728,889, issued Mar. 1, 1988 to D. G. Gadian et al., disclosing a two-pulse-train method for distinguishing a species having two coupled resonances from second and third species, each of which has a resonance which coincides with one of the coupled resonances;

U.S. Pat. No. 4,771,242, issued Sep. 13, 1988 to D. A. Lampman, disclosing a method for selectively stimulating nuclei of interest, without stimulating solvent nuclei, involving judicious selection of magnetic field strength;

U.S. Pat. No. 4,851,777, issued Jul. 25, 1989 to A. Macovski, disclosing an induction coil arrangement which provides for selective sensing of a response from a localized region;

U.S. Pat. No. 4,857,843, issued Aug. 15, 1989 to A. Macovski, disclosing acquisition of desired spectrographic information in the presence of unknown magnetic fields, using a known signal (from water, for example) as reference signal;

U.S. Pat. No. 4,906,932, issued Mar. 6, 1990 to R. J. Ordidge, disclosing a way of eliminating unwanted signals from spatial or frequency regions by means of radio-frequency noise; and U.S. Pat. No. 4,942,359, issued Jul. 17, 1990 to K. Sano et al., disclosing a method for in-vivo imaging of blood vessels, involving the elimination of NMR signals due to blood flow.

Typically, with respect to suppression of an unwanted dominant signal, the disclosed methods depend on good homogeneity of the static magnetic field, and they involve the use of additional radio-frequency pulses—which deposit additional power (generating heat) in a sample. In the field of medical diagnostics, however, magnetic field homogeneity may be degraded due to the presence of the patient (whose volume is many liters rather than just cubic centimeters), and radio-frequency heating is potentially harmful.

The invention described in the following provides for suppression of dominant signals (e.g., signals due to water, fat, or both in organic tissue) without reliance on magnetic field homogeneity or on additional radio-frequency pulses.

SUMMARY OF THE INVENTION

In NMR and MRI, acquisition of a desired signal is facilitated by suppression or cancellation of an unwanted signal, involving subtraction in the time domain. Prior to the measurement proper, a synthetic subtraction or cancellation signal is formed, e.g., by smoothing a free-induction-decay actual signal, by curve fitting, or by computer simulation. In subsequent measurements, a desired signal is obtained upon subtraction of the cancellation signal from a free-induction-decay actual signal generated in an NMR probe, so that the dynamic range of the difference signal is less than the dynamic range of the actual signal.

Preferred apparatus includes a memory for storing a cancellation signal in digital form, digital-to-analog conversion means, a vector modulator to "up-mix" (heterodyne) an audio-frequency analog cancellation signal up to NMR radio frequency, and power combining means for combining a cancellation signal with an actual signal.

DETAILED DESCRIPTION OF PREFERRED EMBODIMENTS

Figure 3:
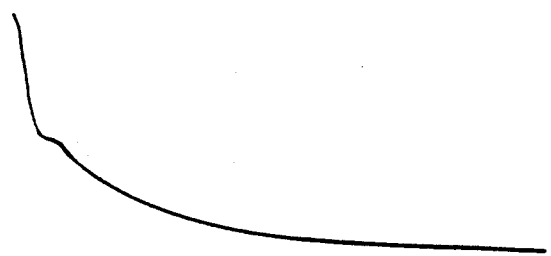
FIG. 3 is a graphic representation, in correspondence with and at the same scale as FIG. 2, of a synthetic cancellation signal obtained by smoothing the signal of FIG. 2.

The following operational description, with reference to the Figures, applies to an aspect of the invention as practiced in a basic NMR-spectroscopy experiment without phase cycling. Preferred signal acquisition is described first, under the assumption that a solvent cancellation signal (FIG. 3) has been obtained previously.

Figure 1:
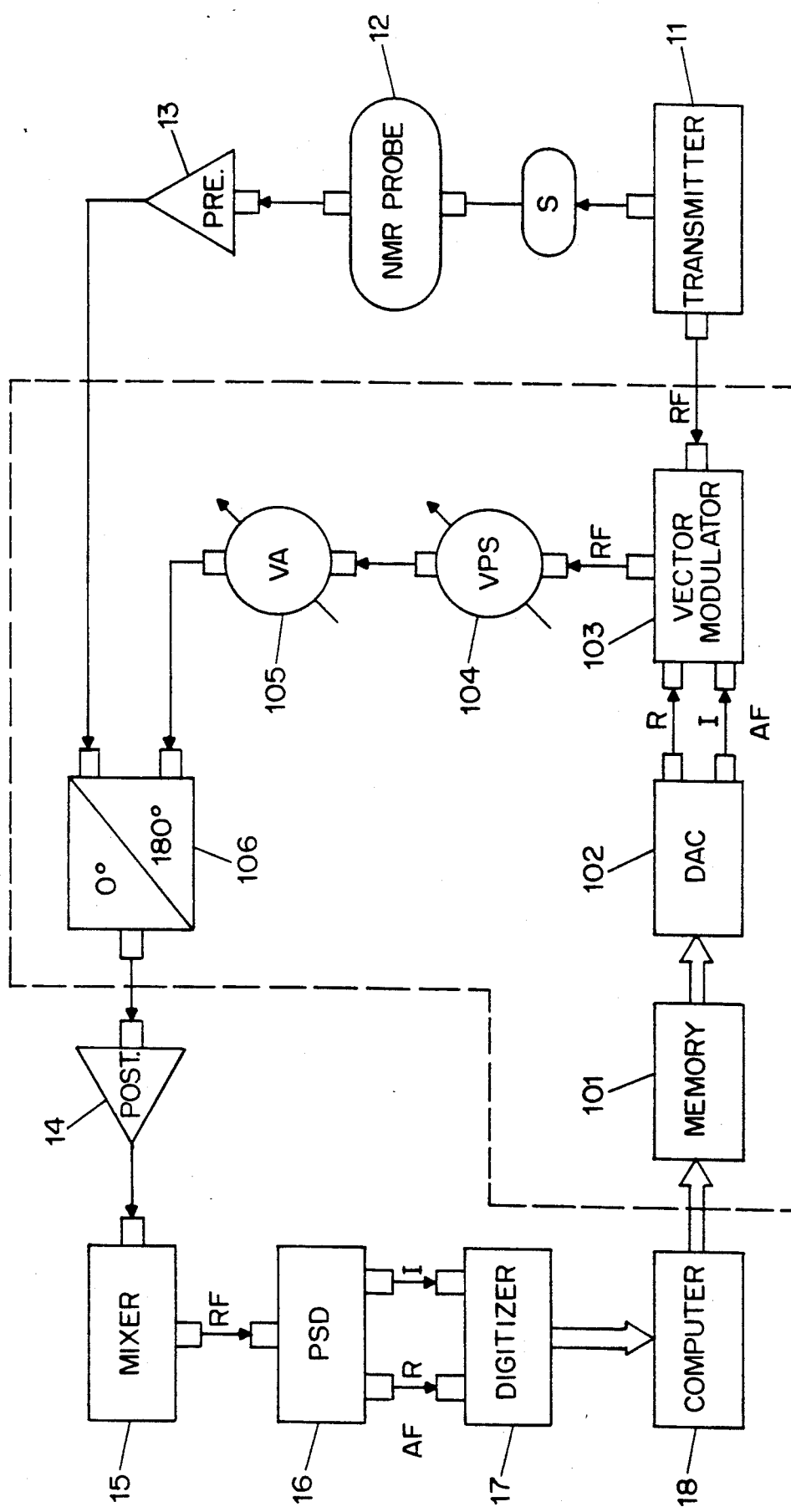
FIG. 1 is a schematic representation of nuclear magnetic resonance apparatus including a signal suppression assembly in accordance with a preferred embodiment of the invention, with a broken line drawn around components which distinguish this embodiment.
Figure 4:
FIG. 4 is a graphic representation of a difference signal, obtained by subtracting the cancellation signal of FIG. 3 from the actual signal of FIG. 2, and amplifying by a low-noise preamplifier with a gain factor of 10.

Shown in FIG. 1 is exemplary NMR-apparatus comprising a transmitter 11 for irradiating a specimen S in a polarizing magnetic field H with a radio-frequency pulse. For example, in an x-y-z coordinate system, the magnetic field may be in the z-direction, and the pulse may be applied in the y-direction. Angles other than 90 degrees between magnetic field and pulse directions may be used, e.g., as in so-called magic-angle experiments. A free-induction-decay signal emitted by specimen S is sensed by NMR-probe 12, and the probe signal is amplified by pre-amplifier 13. In 0°/180° power combiner 106, the pre-amplifier output signal is combined with the cancellation signal in synchronism with the probe signal, such cancellation signal being supplied from digital memory 101 via a digital-to-analog converter 102, a vector modulator 103, an adjustable phase shifter 104, and an adjustable attenuator 105. Adjustment may be by hand or under computer control or both. Phase and amplitude controllers 104 and 105 may be omitted, as equivalent adjustments can be carried out by computer 18. Under the assumption that the phase and amplitude of the cancellation signal match those of the solvent component of the NMR signal, these two signals interfere destructively, leaving only the signal of interest (FIG. 4). Instead of a 0°/180° power combiner as shown, a 0°/0° power combiner may be used, with the cancellation signal adjusted 180° out of phase with the NMR signal.

The output from power combiner 106 (i.e., the difference between the probe signal and the cancellation signal) is amplified by low-noise post-amplifier 14 such that the signal level is well above the noise introduced downstream in the receiver chain. The amplified signal is fed via mixer 15 to phase-sensitive detector 16 whose output is digitized by digitizer 17, and the digital signal data are fed to computer 18 for further processing. If the solvent peak is not wanted in the spectrum, the data may be processed directly. If, on the other hand, the solvent peak is required, the cancellation signal can be scaled and added back to the acquired data in the computer before processing —as dynamic range is of no concern at this point.

As specifically described above, a cancellation signal may be subtracted from a pre-amplified signal. In general, subtraction is preferred just before a dynamic range-limiting component, where the signal is largest, and where noise contributed by the subtraction process is minimized. Thus, if dynamic range is limited by a pre-amplifier, it will be preferable to perform the subtraction beforehand. In some cases, related techniques may also be useful after the mixer or even after phase-sensitive detection.

In accordance with an aspect of the invention, a cancellation signal may be obtained as follows:

1. The radio-frequency (RF) carrier frequency is placed at the approximate center of the solvent resonance.

Figure 2:
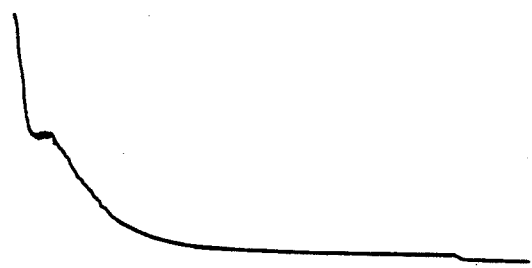
FIG. 2 is a graphic representation of an actual NMR-signal, showing radio-frequency intensity as a function of time, obtained from 1 Molar lactate in water.

2. A reference signal (FIG. 2) is obtained using the same pulse sequence and under similar conditions to those that are to apply for signal acquisition proper. As the amplitude of this reference signal will be much larger than the amplitude of the final signal, it is necessary, e.g., to use lower overall receiver gain here, or to reduce the amplitude of the signal by reducing the final flip angle; otherwise, the dynamic range of the receiver would be exceeded. This reference signal consists of a large solvent signal upon which are superimposed small, higher-frequency oscillations from off-resonance metabolites.

3. A cancellation signal (FIG. 3) is obtained on a computer by smoothing the reference signal, e.g., with a low-pass filter, or by fitting the signal with some analytic or piece-wise analytic function designed to remove the low-amplitude oscillations without significantly altering the solvent signal. The cancellation signal is then phase-shifted, scaled, and downloaded to memory 101.

If phase cycling is employed in the NMR experiment it is necessary to form a different cancellation signal for each different phase step and play it back through the digital-to-analog converter at the appropriate time. Each of the different cancellation signals may be acquired either experimentally or analytically from a single excitation.

For imaging and spectroscopic imaging, hundreds or thousands of different signals may be acquired. As these signals differ with respect to phase and amplitude, a different cancellation signal has to be acquired for each signal upon which subtraction is to be performed. However, since most signals in an acquired set are small, it is unnecessary to perform the subtraction on every signal.

Rather, subtraction need be performed only on a few large-amplitude signals. In a conventional imaging experiment, to avoid artifacts, the subtracted signals may be added back into the acquired data set. This addition is unnecessary on spectroscopic imaging data, as partial subtraction causes artifacts in the solvent peaks only, leaving other peaks unaffected.

With reference to FIG. 1, preferred key components added to conventional NMR apparatus may be described in further detail as follows:

1. A dual-channel memory (101) interfaced to a controlling computer;

2. A dual-channel digital-to-analog converter (102) to synthesize the real (R) and imaginary (I) channels of the audio envelope of the cancellation signal. Preferably, in the interest of minimizing truncation distortions, the precision and resolution of this device are at least as good as those of the digitizer, e.g., approximately 14 to 16 bits, and greater than approximately 100 kilohertz;

3. A vector modulator (103) to combine or up-mix the audio data from the digital-to-audio converter with the carrier frequency, and to generate a cancellation signal with the correct phase, amplitude, and frequency. Sufficient precision, stability, and linearity of this device are important. Good amplitude stability, a noise figure of the order of the detection resolution (1 in 50,000, typically), and good phase stability are desirable for controlled and stable cancellation of every signal;

4. A 0°/180° or 0°/0° power combiner (106) for performing the analog summation of the cancellation signal with the incoming NMR signal;

5. Software to smooth the reference signal in order to generate the cancellation signal. A multipole digital low-pass filter may be used, with a bandpass flatness of the order of 1 in 14-to-15 bits, and a sufficiently sharp cutoff to reject frequency components of interest adjacent to the solvent peak. Alternatively, it may be preferable to fit some suitable function to the data—a decaying sinusoid or a polynomial, for example;

6. Software for control of the extra hardware, i.e., for downloading cancellation-signal data, control of digital-to-analog clock rates and pulse times, selection of cancellation data in the case of multiple cancellation signals, etc.

In principle, a preferred method may also be used to cancel two or more resonances provided they are both well defined. In this case, smoothing by curve fitting is preferred. This method would be of particular interest in body-NMR where there may be unwanted lipid signals almost as intense as the water signal.

Among distinctions and advantages of a preferred apparatus and method are the following: Simple, robust, and inexpensive means are provided for suppressing a large solvent signal, at a stage in the receiver chain where large dynamic range of a signal is not yet a problem. While the technique is particularly useful for in vivo proton spectroscopy, it can be used in any NMR or MRI experiment regardless of nucleus or sample. In magnetic resonance imaging, where the image is essentially a map of water signal intensity, and where the dynamic range of the signal is determined by the ratio of the smallest acquired signal to the signal from the entire imaged volume, the technique may be used, e.g., for reducing the dynamic range of the signal to fit the dynamic range of the mixer. A preferred method does not rely on the use of additional radio-frequency or on magnetic-field pulses applied to the sample, and it does not rely on any intrinsic NMR property of the sample, the solvent, or the peaks of interest, e.g., relaxation time or coupling. Hardware modifications are made in the receiver chain only; no modifications are necessary to the NMR excitation sequence, or the transmitter. A preferred method is insensitive to static-field inhomogeneity, and it can be applied with any radio-frequency pulse sequence, without modification of that pulse sequence. (Since the method does not operate directly on the nuclei, it can be used with complex, sensitive sequences that would not tolerate radio-frequency-based suppression schemes.) And, since no additional radio-frequency pulses are used, no additional power is deposited in a sample/patient, so that there is no additional heating. An undesired peak can be suppressed with minimal distortion even if there is another peak close to it. Finally, a preferred method can be automated to the point where it will require little or no operator intervention in use.

We claim:

1. In magnetic resonance spectroscopy or imaging, a method for acquiring a desired signal in the presence of an unwanted signal whose variation, as a function of time, is less than the variation of said desired signal, comprising the steps of
   (i) subtracting a cancellation signal from a free-induction-decay actual signal,
       whereby said desired signal is obtained with a dynamic range which is less than the dynamic range of said actual signal, and
   (ii) transmitting said desired signal for further processing.

2. The method of claim 1 in which said cancellation signal is obtained from a free-induction-decay reference signal consisting essentially of superposed desired and unwanted signals.

3. The method of claim 2 in which said cancellation signal is obtained by smoothing said reference signal.

4. The method of claim 2 in which said cancellation signal is obtained by approximating said reference signal by a function which is at least piece-wise analytic.

5. The method of claim 1 in which said cancellation signal is subtracted ahead of a processing step in which dynamic range is limited.

6. The method of claim 5 in which said processing step comprises amplification.

7. The method of claim 1 in which said cancellation signal is added to said desired signal after digitization.

8. The method of claim 1, comprising phase cycling and subtraction of different cancellation signals.

9. The method of claim 1, comprising imaging and subtraction of different cancellation signals.

10. The method of claim 9 in which subtraction is applied to selected actual signals.

11. The method of claim 1 in which further processing comprises amplification.

12. Magnetic resonance spectroscopy or imaging apparatus comprising a source of radio-frequency radiation, means for sensing a free-induction-decay signal, and means for processing said sensed signal, said processing means comprising
    memory means for storing a cancellation signal, and
    signal subtraction means for subtracting said cancellation signal from said sensed signal.

13. The apparatus of claim 12 in which said memory means comprises a digital memory, and further comprising a digital-to-analog converter connected to said memory means.

14. The apparatus of claim 13, further comprising a vector modulator to said digital-to-analog converter.

15. The apparatus of claim 12 in which said subtraction means comprises a 0°/180° power combiner.

16. The apparatus of claim 12 in which said subtraction means comprises a 0°/0° power combiner.

17. The apparatus of claim 14, further comprising an adjustable phase shifter and an adjustable attenuator.

18. The apparatus of claim 17 in which said phase shifter is computer controlled.

19. The apparatus of claim 17 in which said attenuator is computer controlled.

* * * * *

UNITED STATES PATENT AND TRADEMARK OFFICE
CERTIFICATE OF CORRECTION

PATENT NO. : 5,221,899
DATED : June 22, 1993
INVENTOR(S) : O. Gonen et al.

It is certified that error appears in the above-indentified patent and that said Letters Patent is hereby corrected as shown below:

Col. 1, before line 5, insert:

--The United States Government has certain rights in this invention pursuant to award No. 5-P01-CA28881 by the National Institute of Health.--

Signed and Sealed this

Fourth Day of October, 1994

Attest:

BRUCE LEHMAN

*Attesting Officer*      *Commissioner of Patents and Trademarks*